United States Patent
Elbaz (10) Patent No.: US 9,444,179 B1
(45) Date of Patent: Sep. 13, 2016

(54) SECURE DUAL MOUNT COVER FOR OUTDOOR ELECTRICAL DEVICES

(71) Applicant: Michael Elbaz, New York, NY (US)

(72) Inventor: Michael Elbaz, New York, NY (US)

(73) Assignee: Superflex, Ltd., Brooklyn, NY (US)

( * ) Notice: Subject to any disclaimer, the term of this patent is extended or adjusted under 35 U.S.C. 154(b) by 0 days.

(21) Appl. No.: 14/975,088

(22) Filed: Dec. 18, 2015

(51) Int. Cl.
| | | |
|---|---|---|
| *H02G 3/08* | (2006.01) | |
| *H01H 9/04* | (2006.01) | |
| *H01R 13/52* | (2006.01) | |
| *H05K 5/03* | (2006.01) | |
| *H05K 5/02* | (2006.01) | |
| *H05K 5/06* | (2006.01) | |
| *H02G 3/14* | (2006.01) | |
| *H01R 13/447* | (2006.01) | |

(52) U.S. Cl.
CPC ........ *H01R 13/5213* (2013.01); *H01R 13/447* (2013.01); *H02G 3/088* (2013.01); *H02G 3/14* (2013.01); *H05K 5/0221* (2013.01); *H05K 5/0239* (2013.01); *H05K 5/03* (2013.01); *H05K 5/06* (2013.01)

(58) Field of Classification Search
CPC ........ H02G 3/14; H02G 3/081; H02G 3/088; H05K 5/0239; H05K 5/0208; H05K 5/0221; H05K 5/0226; H05K 5/03; H05K 5/06; H05K 5/0217; H01H 21/08; H01R 13/5213; H01R 13/52; H01R 13/447

USPC ........ 220/3.2, 3.7–3.9, 241–242; 174/66, 67, 174/53–55, 57, 480, 481, 50.5, 50.51, 520, 174/535, 560, 561, 562, 564, 660; 439/135, 439/142, 136; 29/592, 428, 432

See application file for complete search history.

(56) References Cited

U.S. PATENT DOCUMENTS

| | | | |
|---|---|---|---|
| 6,642,453 B2 | 11/2003 | Shotey et al. | |
| 7,462,777 B2 * | 12/2008 | Dinh .................. | H01R 13/5213 174/58 |
| 7,728,226 B2 | 6/2010 | Drane et al. | |
| 7,915,528 B2 | 3/2011 | Ni | |
| 8,106,295 B1 | 1/2012 | Shotey et al. | |
| 8,314,334 B1 | 11/2012 | Cleghorn et al. | |
| 2009/0211779 A1 * | 8/2009 | Drane ..................... | H02G 3/14 174/67 |

* cited by examiner

*Primary Examiner* — Dimary Lopez Cruz (74) *Attorney, Agent, or Firm* — Seth Natter; Natter & Natter (57) ABSTRACT

A cover for outdoor electrical devices includes a rectangular base having a rear, side and bottom panels. A peripheral flange surrounds the base. Haspways are provided in diagonally opposed corners of the flange, with the haspways being closed by a web. A lid is hinged to the top panel, for orientation in a vertical position or to a side panel for orientation in a horizontal position. An aperture at a lower corner of the lid registers with a lower haspway. To secure the cover, the lower haspway web is broken and padlock shackle inserted through the open haspway and lid aperture. The haspway at the upper corner of the base flange remains closed by the web to preclude the entrance of water into the interior of the cover.

20 Claims, 9 Drawing Sheets

SECURE DUAL MOUNT COVER FOR OUTDOOR ELECTRICAL DEVICES

BACKGROUND OF THE INVENTION

1. Field of the Invention

This invention relates generally to outdoor electrical device covers and more particularly to a watertight dual mount cover having haspways for engagement by a padlock shackle or other securement mechanism.

2. Antecedents of the Invention

Dual mount covers for outdoor electrical devices provided for lid hinge connections either on the top of a rectangular base for vertical mounting, or on the side of the base which was then rotated 90 degrees, for horizontal mounting, as exemplified in U.S. Pat. No. 6,642,453 B2.

Among the problems encountered with dual mount covers was that the generally did not provide for securing the cover, hence the electrical device, against unauthorized access. While registered hasp openings for a padlock and the like have been provided on cover assemblies, as illustrated in U.S. Pat. No. 8,314,334 and U.S. Pat. No. 7,728,226, the were formed on forwardly projecting flanges and created a potential hazard of catching or snagging on one's clothing and were generally conspicuous, especially when not employed for securing the lid in a closed position. This problem was exacerbated when the cover was a dual use cover because two diagonally positioned flanges were then required to project from the cover base and only one could possibly be employed.

SUMMARY OF THE INVENTION

A secure dual mount cover for outdoor electrical devices includes a rectangular base having a rear panel as well as top, side and bottom panels. A laterally projecting peripheral flange surrounds the proximal edges of the base. Haspways are provided in diagonally opposed corners of the base flange, with the haspways being closed by an integral web molded in one piece with the base prior to on site assembly.

A lid is hinged to the top panel, for orientation in a vertical mount position or to an orthogonal side panel (with the side panel now on top), for orientation in a horizontal mount position. An aperture at a lower corner of the lid will register with a lower haspway of the base flange, in either vertical or horizontal orientation, when the lid is closed. To secure the cover in a closed position, the lower haspway web is broken so that a security member such as padlock shackle, a bolt, a plastic or wire seal or band, etc., can be inserted through the registered open haspway and lid aperture. The haspway at the upper corner of the base flange remains closed by the web to preclude the entrance of water into the interior of the cover.

As such, the interior of the dual mount cover will be sealed against water penetration through the uppermost haspway by the unbroken web.

From the foregoing compendium, it will be appreciated that an aspect of the present invention is to provide a dual mount cover for outdoor electrical devices of the general character described which is not subject to the foregoing disadvantages of the antecedents of the invention.

A feature of the present invention is to provide a secure dual mount cover for outdoor electrical devices of the general character described which is simple to assemble and easy to use.

A consideration of the present invention is to provide a secure dual mount cover for outdoor electrical devices of the general character described which is well suited for extreme weather conditions.

A further aspect of the present invention is to provide a secure dual mount cover for outdoor electrical devices of the general character described which is well suited for economical mass production fabrication.

A still further consideration of the present invention is to provide a secure dual mount cover for outdoor electrical devices of the general character described wherein padlock shackle haspways are smoothly integrated into the structure of a base or base without the necessity of employing projecting flanges.

Another feature of the present invention is to provide a secure dual mount cover for outdoor electrical devices of the general character described which incorporates inconspicuous haspways for securing a lid in a closed position.

An additional consideration of the present invention is to provide a secure dual mount cover for outdoor electrical devices of the general character described wherein haspways are maintained watertight by an integral web one of which may be broken away for employment in securing the cover against unauthorized access.

To provide a secure dual mount cover for outdoor electrical devices of the general character described wherein a lid may be mounted to either of a pair of orthogonal hinge assemblies while water entry from an unemployed haspway is precluded is a further consideration of the present invention.

Other aspects, features and considerations of the present invention in part will be obvious and in part will be pointed out hereinafter.

With these ends in view, the invention finds embodiment in various combinations of elements, arrangements of parts and series of steps by which the above-mentioned aspects, features and considerations and certain other aspects, features and considerations are attained, or with reference to the accompanying drawings and the scope of which will be more particularly pointed out and indicated in the appended claims.

BRIEF DESCRIPTION OF THE DRAWINGS

In the accompanying drawings, wherein some of the various possible exemplary embodiments of the invention are shown.

DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements.

Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein.

Moreover, applicant does not intend for any term in the specification or claims to be ascribed an uncommon or special meaning unless explicitly set forth as such. Further, the present invention encompasses present and future known equivalents to the known components referred to herein by way of illustration.

Referring now in detail to the drawings the reference numeral 10 denoted a secure dual mount cover for outdoor electrical devices constructed in accordance with the invention including a substantially rectangular base 12, having a rear panel 14. A top panel 16, a right side panel 18, a left side panel 20 and a bottom panel 22 extend along planes generally perpendicular to the plane of the rear panel 14. A peripheral flange 24 surrounds the proximal edges of the panels 16, 18, 20 and 22. With reference to FIGS. 5, 6, 8 and 9, it should be noted that the flange 24 includes an outer bead or rib 25 and an inner bead or rib 27 which define a channel 29 therebetween. The base 12 is preferably molded in one piece of a suitable thermoplastic or other durable material.

A weatherproof lid 26 may be hinged to either the top panel 16, for orientation of the dual mount cover 10 in a vertical position, or the right side panel 18, for orientation of the dual mount cover in a horizontal position. Throughout the drawing figures, the dual mount cover 10 is illustrated as being a vertical position with the lid 26 hinged to the top panel 16, for covering an electrical device mounted within an electrical box in a vertical orientation, except, however, in FIG. 7, wherein the dual mount cover 10 is illustrated in a horizontal position, for covering an electrical device mounted within an electrical box in a horizontal orientation. The lid 26 is also preferably molded in one piece of a suitable thermoplastic or other durable material.

Figure 1:
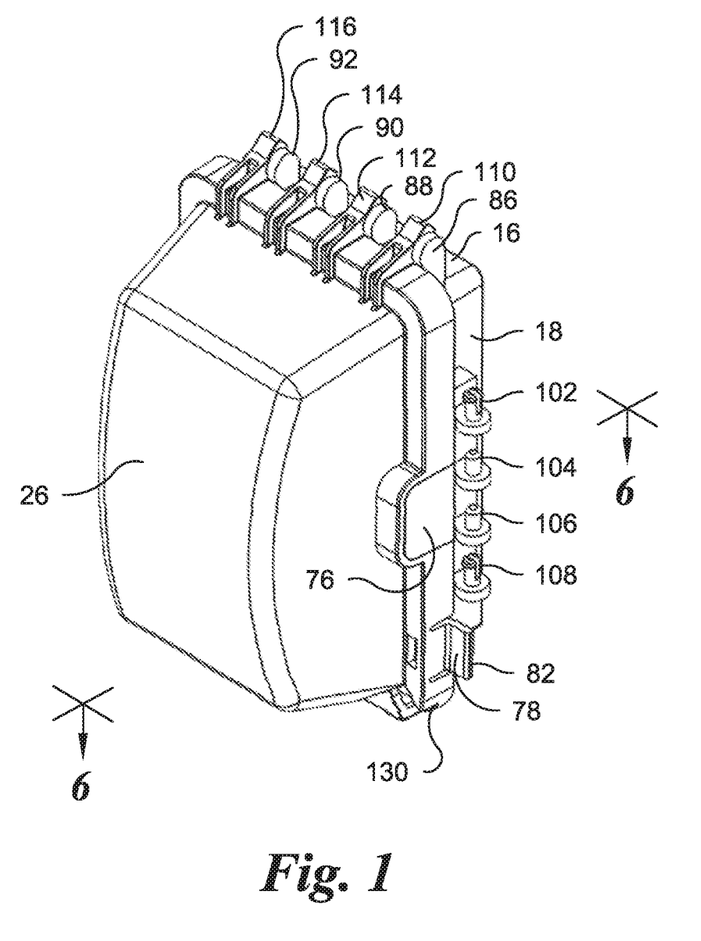
FIG. 1 is an isometric view of a secure dual mount cover for outdoor electrical devices constructed in accordance with and embodying the present invention showing a lid hinged to a base oriented in a vertical mount position.
Figure 2:
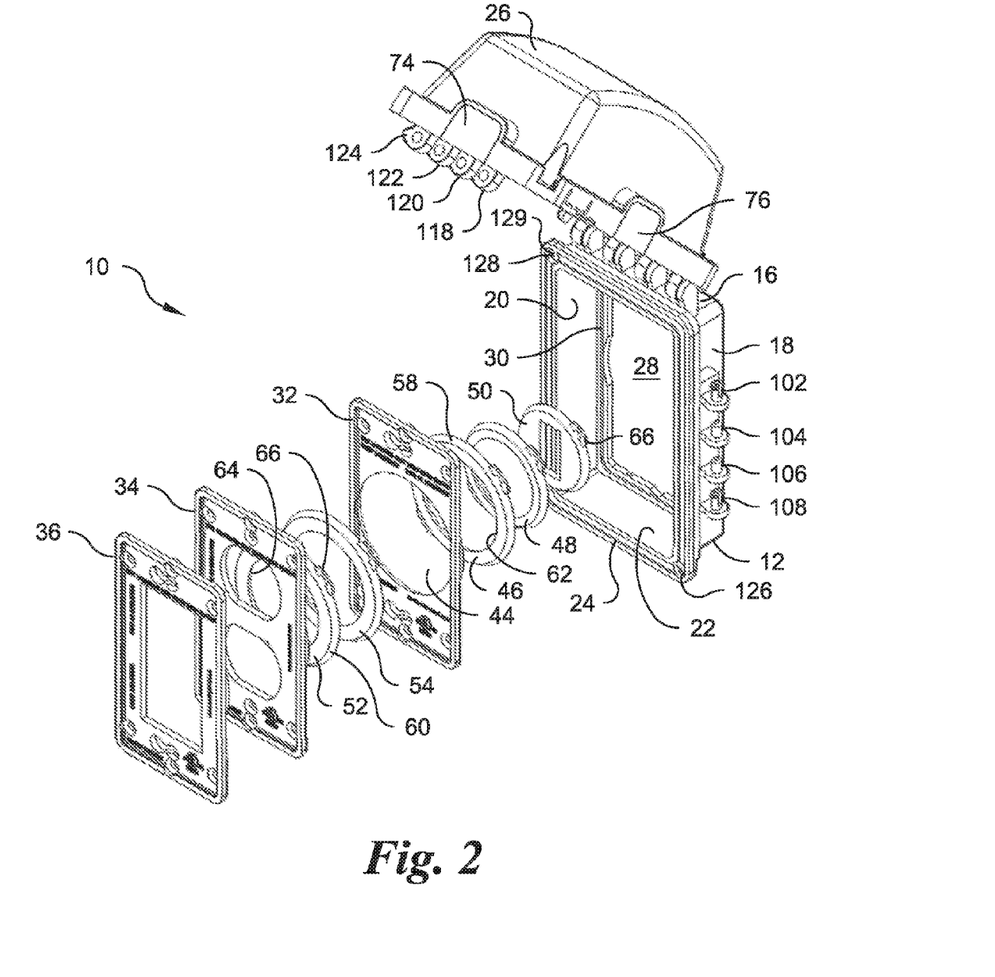
FIG. 2 a front isometric view, similar to FIG. 1, with the lid in open position and showing a lower haspway opening formed in a flange of a base by breaking an integral closure web and an upper left closed haspway wherein the web is unbroken.
Figure 3:
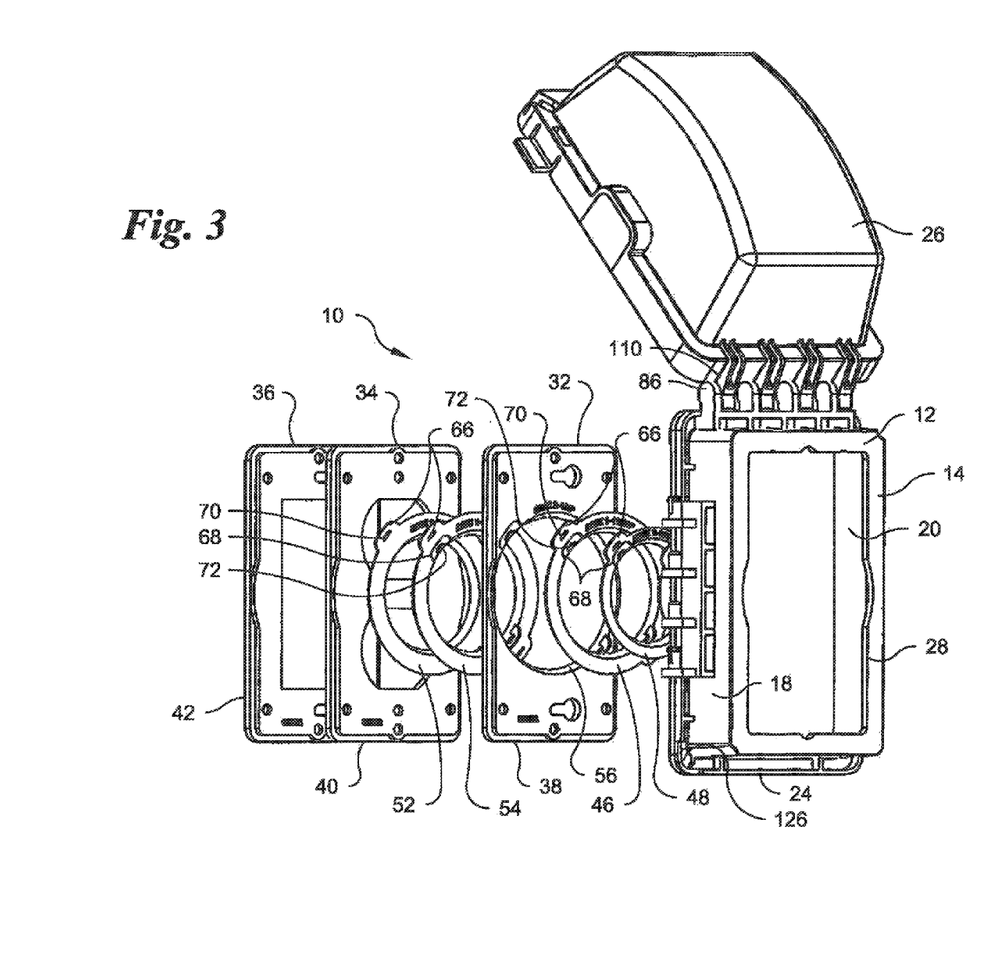
FIG. 3 is a rear elevational exploded view of the dual mount cover showing the lower right haspway opening.
Figure 4:
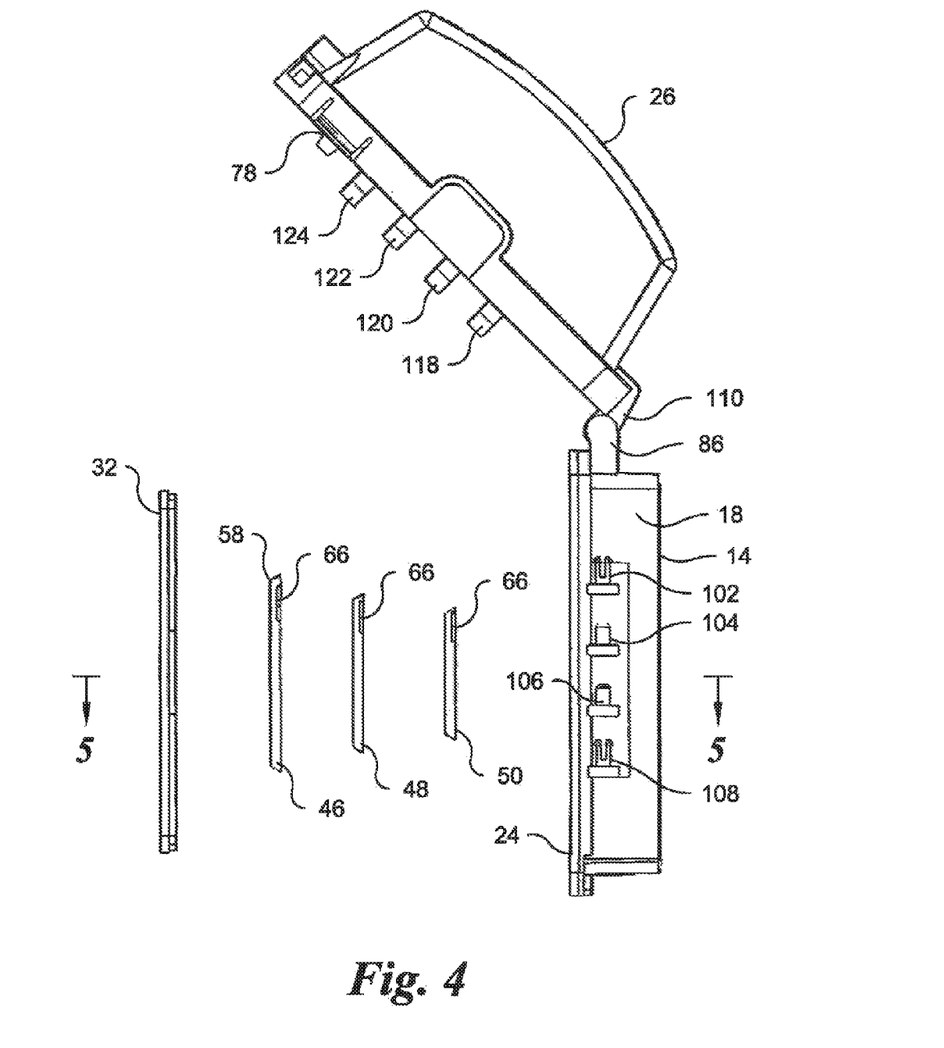
FIG. 4 is a side elevational exploded view of the dual mount cover.

With attention directed to FIGS. 2 and 3, it should be noted that the rear panel 14 includes an orifice 28 of generally rectangular shape surrounded by a peripheral recess 30 formed on the inner or front face of the rear panel 14.

The dual mount cover 10 includes a plurality of adapter plates 32, 34 and 36, each of which is dimensioned to be received within the orifice 28. From an examination of FIG. 3, it will be noted that each of the adapter plates includes a peripheral flange of reduced thickness 38, 40, 42 which is dimensioned to seat in the peripheral recess 30.

The adapter plates 34, 36 include openings configured to cover and permit access to the face of a duplex receptacle and devices having rectangular faces including GFCI receptacles respectively. A variety of mounting holes extend through each adapter plate, with the mounting holes configured to receive selected mounting screws for securing the entire cover comprising the assembled cover 10 to an electrical box carrying the electrical device to be covered.

Pursuant to the invention, the adapter plate 32 includes an opening 44 configured to receive on its rear face at least one of a plurality of inserts 46, 48, 50, 52, 54 for effecting a change in the dimensions of the opening such that the opening size selected will accommodate the face of an electrical device being installed. It should be noted that for convenience of illustration only, FIGS. 2 and 3 illustrate the inserts 52 and 54 in front of the adapter plate 32, whereas if selected, they are to be inserted at the rear face of the adapter plate 32.

Figure 5:
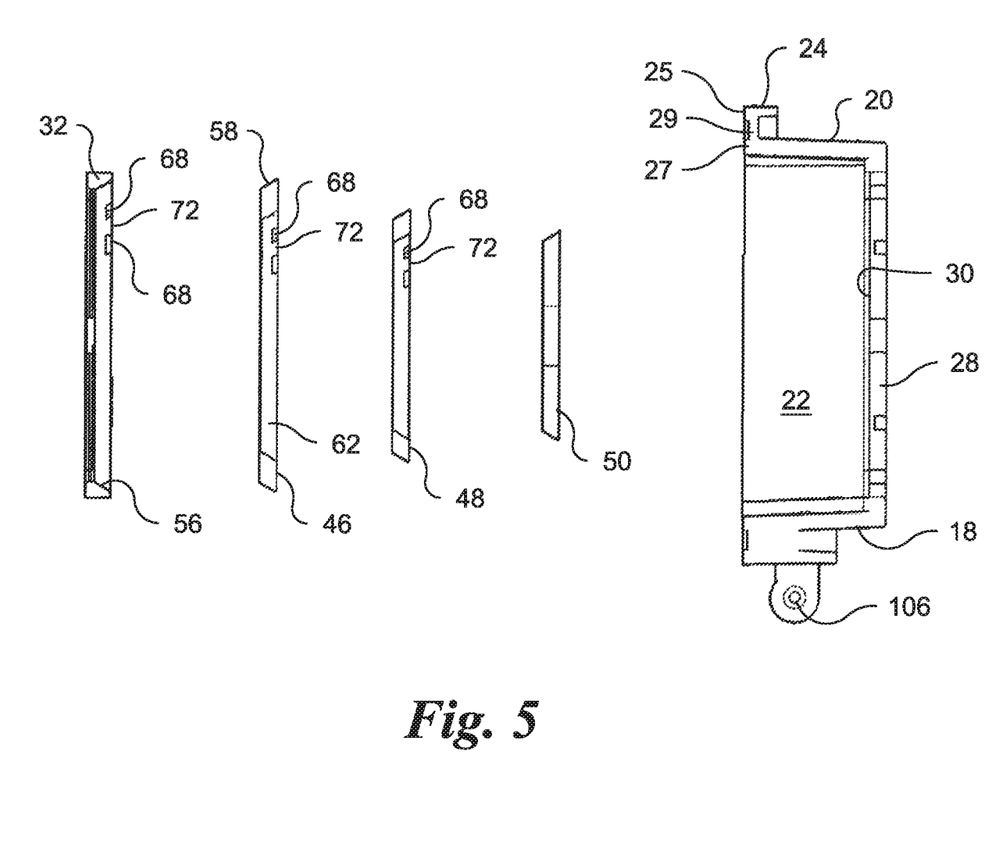
FIG. 5 is a sectional view taken along the plane 5-5 of FIG. 4.

The adapter plate opening 44 is defined by an inwardly tapered chamfered wall 56, best illustrated in FIGS. 3 and 5. A frustum insert 46 or 52, having a matingly tapered external surface 58, 60 and a chamfered wall opening may be seated in the adapter plate opening 44. Successive frustum inserts 48, 54, each having a smaller chamfered wall opening, may be inserted within a rear face the opening 62, 64 of the previously seated insert (46, 52, respectively). The opening in the adapter plate 32 and the openings of the frustum inserts 46, 48, 50, 52, 54 are dimensioned to receive the face of a different electrical device. The frustum insert 50 comprises a plug having a rectangular toggle switch opening and may be seated the opening of the frustum insert 48.

While the frustum inserts, 46, 48, 52, and 54, by way of example only, comprise frustoconical rings, it should be appreciated that pyramidical or oval frustum inserts could be employed with noncircular and/or circular openings configured to accept the faces of electrical devices having corresponding shapes and/or other successively smaller frustum inserts.

Each of the frustum inserts includes a pair of radially extending diametrically opposed registration tabs 66 configured for placement within in correspondingly dimensioned recessed seats 68 formed in the rear face of the adapter plate 32, as well as the rear faces of the frustum inserts 46, 48, 52 and 54. There is also provided a notch 70 in each tab 66 and a post 72, projecting from each seat fits within the notch to secure the frustum insert against rotation or dislodgement from its opening within which it is received prior to complete assembly of the cover.

Figure 6:
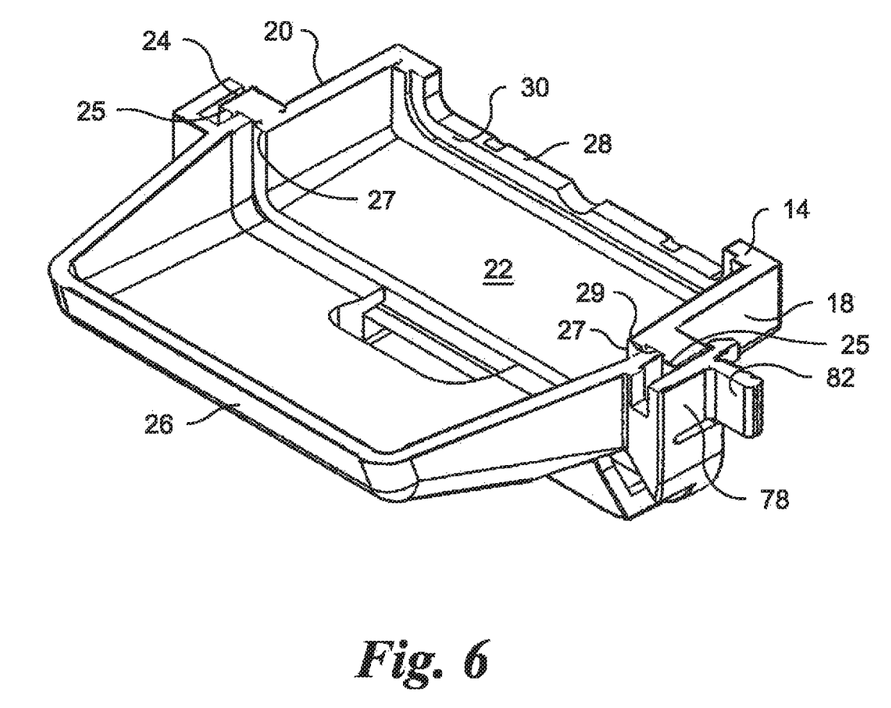
FIG. 6 is an enlarged scale sectional view taken along the plane 6-6 of FIG. 1, with components deleted for clarity and showing a latch mechanism for securing the lid in a closed position.
Figure 7:
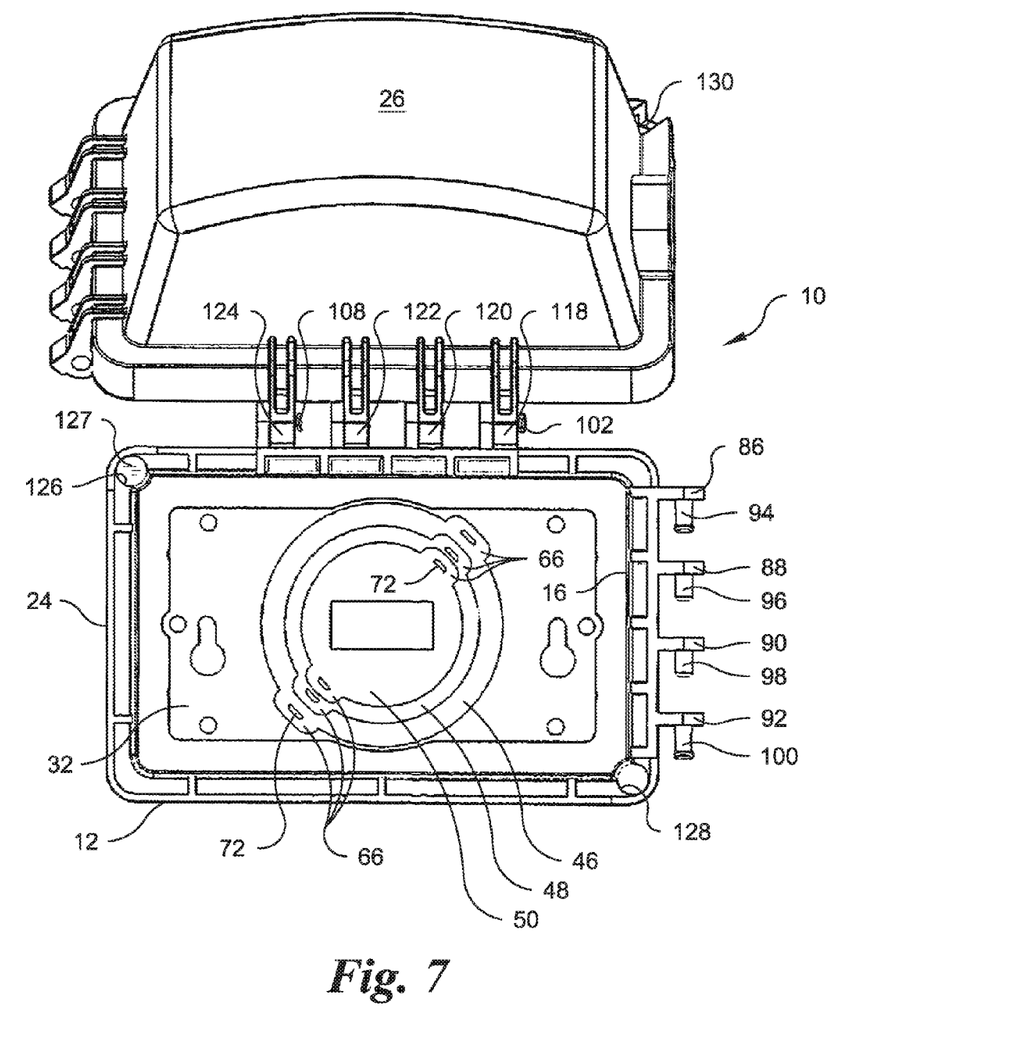
FIG. 7 is an enlarged scale rear elevation view of the dual mount cover in a horizontal mount position, with the lid hinged to a side panel of the base and showing an open lower haspway formed by breaking an integral closure web and an upper closed haspway, wherein the web is unbroken.

When configured in the orientation of FIGS. 1-6, an integral electric cord knock out panel 74 at the bottom of the lid 26 is removed to provide an in use passageway, illustrated in FIG. 6, while when the lid is hinged about the right side edge, with the hinge being horizontally oriented at the top of the electric box, as illustrated in FIG. 7, a knock out panel 76 is removed.

The lid 26 is maintained in a closed position by an integral latch 78, best illustrated in FIG. 6, having a flange 80, which engages a keeper surface on the rear face of the base peripheral flange 24. To release the latch 78 and open the lid, a grip 82 is pulled forwardly.

Both the top and right side of the base 12 include integral arrays of hinge pins and the top and left side panels of the lid 26 include mating arrays of hinge knuckles. The lid 26 is mounted to either array of pins, depending upon the orientation of the electric box base the device, such that the lid 26 is hinged in a generally horizontal plane adjacent the top of the electric box. One or more pins of each array is longer than its respective knuckle, is slotted and has a mushroomed head to prevent inadvertent hinge separation.

As shown in FIG. 7, wherein the hinge pins associated with the top panel 16 are illustrated, a platform 84 which is integral with the base 12 includes a plurality of pin flanges 86, 88, 90 and 92. Each of the pin flanges includes an integral pin 94, 96, 98 and 100, all of which are coaxial. One or more hinge pins 94, 100, are longer than the remaining pins, include mushroomed heads and are axially slotted to enable compression of the mushroomed heads. An identical orthogonal array of hinge pins 102, 104, 106, and 108 are formed on the right side panel 18, with the slots being best illustrated in FIG. 4.

An array of hinge knuckles 110, 112, 114 and 116, which are configured to mate with the top panel hinge pin arm, is formed integral with the peripheral flange of the lid 26 while an array of hinge knuckles 118, 120, 122 and 124, configured to mate with the orthogonal right side panel hinge pin array, is also formed integral with the peripheral flange of the lid 26. The lid 26 is mounted to the base 12 by registering the bores of a selected knuckle array with the hinge pins of the selected hinge pin array and sliding the knuckles over the hinge pins, compressing the mushroom heads. When the knuckles are fully seated over the pins and the knuckles abut their respective hinge flanges, the mushroom heads extend beyond their knuckles and expand to prevent inadvertent disengagement.

It should be noted that a pair of haspways 126, 128 are formed through opposed diagonal corners of the base peripheral flange 24. When the lid is closed, a lowermost one of the haspways 126 or 128 will be in registration with an aperture 130 formed in a corner of the lid peripheral flange so as to permit the lid to be locked by way of a padlock, wire seal, etc.

Figure 8:
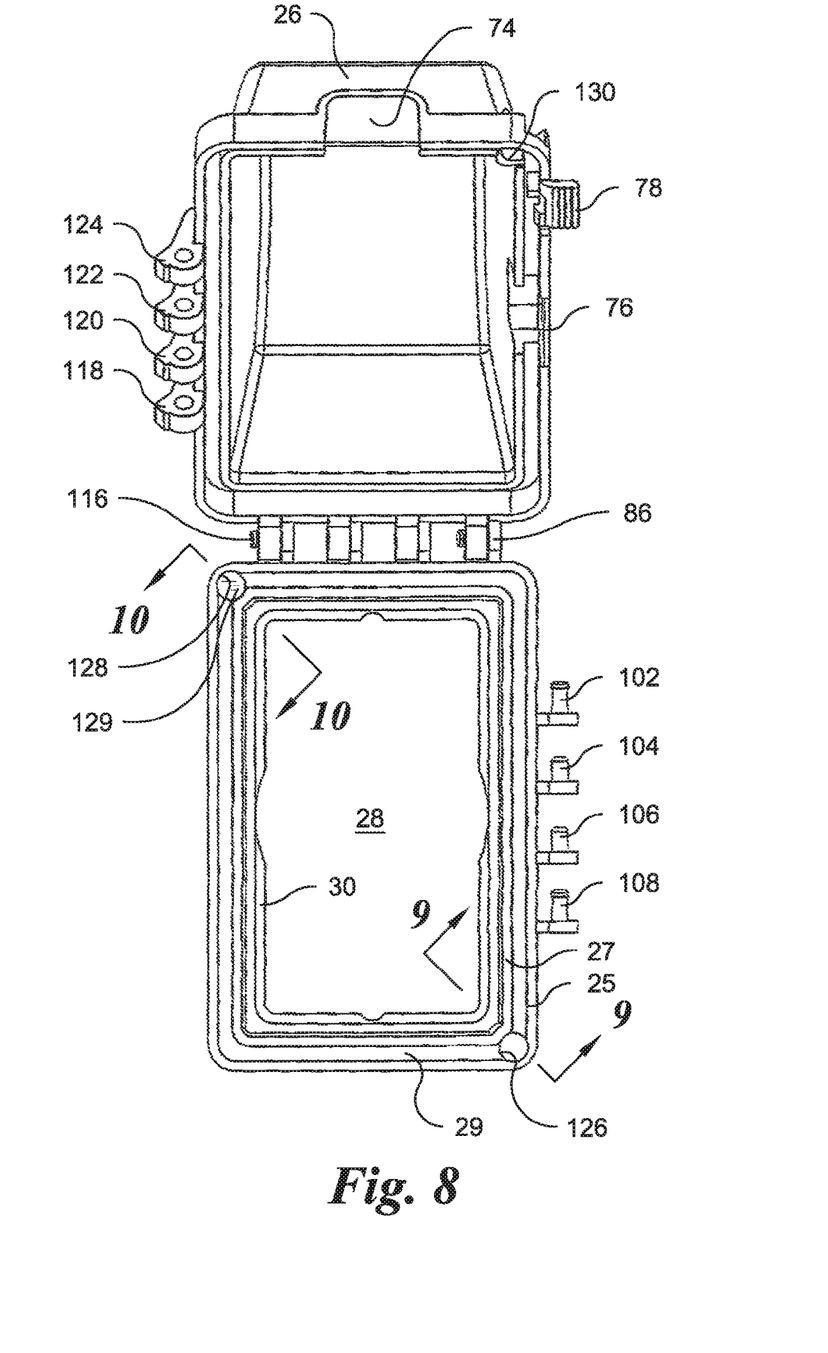
FIG. 8 is a front elevational view of the dual mount cover in the vertical mount position, with portions deleted for clarity.
Figure 9:
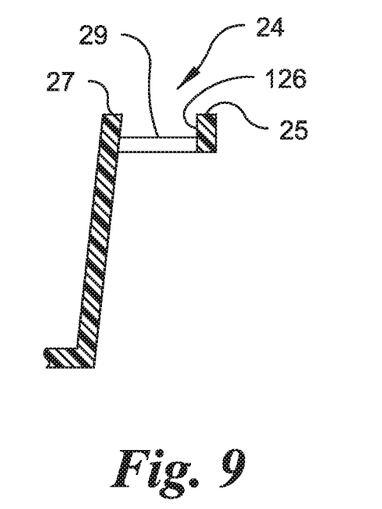
FIG. 9 is an enlarged scale sectional view through an open lower haspway, the same being taken along the plane 9-9 of FIG. 8.
Figure 10:
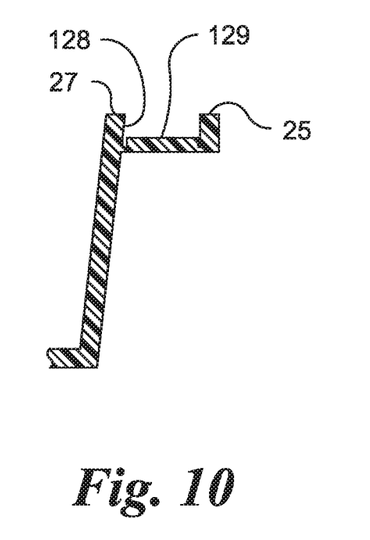
FIG. 10 is an enlarged scale sectional view through a closed upper haspway, the same being taken along the plane 10-10 of FIG. 8.

In accordance with the invention, the base 12 is molded in one piece with the haspway 126 closed by an integral web 127 (illustrated in FIG. 7) and the haspway 128 closed by an integral web 129 (illustrated in FIGS. 8 and 10). The thickness of the webs 127, 129 is reduced, at least around their peripheral junctions with the haspways 126, 128 respectively, in order to facilitate removal by being broken away, knocked out or punched out with a suitable tool, e.g., a screwdriver, drift pin, or other implement which is dimensioned for insertion through the haspway.

If the cover is mounted in a vertical position and it is desired to secure the electrical device from unauthorized access, the web 127 is broken away, as illustrated in FIGS. 2, 3 and 8, for receiving a security member, e.g., a padlock shackle, bolt, wire seal, tie strap or the like through the registered aperture 130 and haspway 126.

If the cover is mounted in a horizontal position and it is desired to secure the electrical device from unauthorized access, the web 129 is broken away, as illustrated in FIG. 7, for receiving a security member, e.g., a padlock shackle, bolt, wire seal, tie strap or the like through the registered aperture 130 and haspway 128.

Thus it will be seen that there is provided a dual mount cover for outdoor electrical devices which achieves the various aspects, features and considerations of the present invention and which is well suited for practical use.

All publications and references cited herein are expressly incorporated herein by reference in their entirety.

In the figures of this application, in some instances, a plurality of elements may be shown as illustrative of a particular element, and a single element may be shown as illustrative of a plurality of a particular elements. Showing a plurality of a particular element is not intended to imply that a system or method implemented in accordance with the invention must comprise more than one of that element or step, nor is it intended by illustrating a single element that the invention is limited to embodiments having only a single one of that respective element. Those skilled in the art will recognize that the numbers of a particular element shown in a drawing can, in at least some instances, be selected to accommodate the particular user needs.

The particular combinations of elements and features in the above-detailed embodiments are exemplary only, the interchanging and substitution of these teachings with other teachings in this and the incorporated-by-reference patents and applications are also expressly contemplated. As those skilled in the art will recognize, variations, modifications, and other implementations of what is described herein can occur to those of ordinary skill in the art without departing from the spirit and the scope of the invention as claimed.

Further, in describing the invention and in illustrating embodiments of the invention in the figures, specific terminology, numbers, dimensions, materials, etc. are used for the sake of clarity. However the invention is not limited to the specific terms, numbers, dimensions, materials, etc. so selected, and each specific term, number, dimension, material, etc., at least includes all technical and functional equivalents that operate in a similar manner to accomplish a similar purpose. Use of a given word, phrase, number, dimension, material, language terminology, product brand, etc. is intended to include all grammatical, literal, scientific, technical, and functional equivalents. The terminology used herein is for the purpose of description and not limitation.

Having described the preferred embodiments of the invention, it will now become apparent to one of ordinary skill in the art that other embodiments incorporating their concepts may be used. Moreover, those of ordinary skill in the art will appreciate that the embodiments of the invention described herein can be modified to accommodate and/or comply with changes and improvements in the applicable technology and standards referred to herein. For example, the technology can be implemented in many other, different, forms, and in many different environments, and the technology disclosed herein can be used in combination with other technologies. Variations, modifications, and other implementations of what is described herein can occur to those of ordinary skill in the art without departing from the spirit and the scope of the invention as claimed. It is felt therefore that these embodiments should not be limited to disclosed embodiments but rather should be limited only by the spirit and scope of the appended claims.

The particular combinations of elements and features in the above-detailed embodiments are exemplary only; the interchanging and substitution of these teachings with other teachings in this and the referenced patents/applications are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto.

Having thus described the invention, there is claimed as new and desired to be secured by Letters Patent:

1. A secure dual mount cover for outdoor electrical devices comprising a base and a lid hinged to the base, the base having a pair of haspways, one haspway being positioned at an upper portion of the base and the other haspway being positioned at a lower portion of the base when the dual mount cover is oriented to cover an electrical device mounted in a vertical position, the other haspway being positioned at an upper portion of the base and the one haspway being positioned at the lower portion of the base when the dual mount cover is oriented to cover an electrical device mounted in a horizontal position, an integral web spanning the one haspway or the other haspway, whichever is positioned at the upper portion of the base to preclude the entrance of water, a lower portion of the lid including an aperture in registration with the one haspway or the other haspway, whichever is positioned at a lower portion of the base when the lid is closed.

2. The secure dual mount cover for outdoor electrical devices as constructed in accordance with claim 1 wherein the one haspway or the other haspway, whichever is positioned at the lower portion of the base, is formed with an integral web, the web being removable to provide a haspway opening in registration with the aperture in the lower portion of the lid for receiving a security member therethrough.

3. The secure dual mount cover for outdoor electrical devices as constructed in accordance with claim 2 wherein each web includes a weakened area of reduced thickness to facilitate removal.

4. The secure dual mount cover for outdoor electrical devices as constructed in accordance with claim 2 wherein a weakened area of reduced thickness is formed at a juncture of the web and the one haspway or the other haspway, whichever is positioned at the lower portion of the base.

5. A method of covering an outdoor electrical device comprising the steps of:
   a) providing the secure dual mount cover for outdoor electrical devices as constructed in accordance with claim 2,
   b) determining whether the one haspway or the other haspway will be positioned at the lower portion of the base by determining whether the electrical device to be covered is in the vertical position or the horizontal position,
   c) providing the haspway opening through the haspway to be positioned at the lower portion of the base by removing the web from the haspway to be positioned at the lower portion of the base,
   d) closing the lid and registering the lid aperture with the haspway opening, and
   e) securing the electrical device against unauthorized access by extending the security member through the registered lid aperture and the haspway opening.

6. The method of covering an outdoor electrical device in accordance with claim 5 wherein the security member is selected from the group consisting of a padlock shackle, a bolt, a wire seal and a tie strap.

7. The secure dual mount cover for outdoor electrical devices as constructed in accordance with claim 1 wherein the base is substantially rectangular and the pair of haspways are positioned at diagonally opposed corners of the base.

8. The secure dual mount cover for outdoor electrical devices as constructed in accordance with claim 1 wherein the base includes a first set of base hinge elements and a second set of base hinge elements, the first and second sets of base hinge elements being orthogonal and the lid includes a first set of lid hinge elements and a second set of lid hinge elements, the first and second sets of lid hinge elements being orthogonal, the first set of base hinge elements engaging the first set of lid hinge elements when the dual mount cover is oriented to cover an electrical device mounted in a vertical position and the second set of base hinge elements engaging the second set of lid hinge elements when the dual mount cover is oriented to cover the electrical device mounted in the horizontal position.

9. The secure dual mount cover for outdoor electrical devices as constructed in accordance with claim 8 wherein the base comprises a rear panel, a top panel, a bottom panel and a pair of side panels, the first set of base hinge elements extend from the top panel and the second set of base hinge elements extend from one of the pair of side panels.

10. The secure dual mount cover for outdoor electrical devices as constructed in accordance with claim 8 wherein the base includes a top, a bottom and a pair of sides, the first set of base hinge elements extend from the top and the second set of base hinge elements extend from one of the pair of sides.

11. The secure dual mount cover for outdoor electrical devices as constructed in accordance with claim 1 wherein the base includes a peripheral flange and the pair of haspways are positioned within the peripheral flange.

12. The secure dual mount cover for outdoor electrical devices as constructed in accordance with claim 11 wherein the base is substantially rectangular and the pair of haspways are positioned at diagonally opposed corners of the base.

13. The cover for outdoor electrical devices comprising a substantially rectangular base and a lid hinged to the base, the base having a pair of haspways positioned at diagonally opposite corners of the base, the pair of haspways including an integral web precluding passage of water through the pair of haspways, one haspway being positioned at an upper portion of the base and the other haspway being positioned at a lower portion of the base when the cover is oriented to cover an electrical device, a lower portion of the lid including an aperture in registration with the other haspway when the lid is closed, the integral web of the other haspway being removable to provide a haspway opening for a security member to extend through the registered lid aperture and haspway opening.

14. The cover for outdoor electrical devices as constructed in accordance with claim 13 wherein the base includes a peripheral flange and the pair of haspways are positioned within the peripheral flange.

15. The cover for outdoor electrical devices as constructed in accordance with claim 13 wherein the web of the other haspway includes a weakened area of reduced thickness to facilitate removal.

16. The cover for outdoor electrical devices as constructed in accordance with claim 13 wherein the base is unitarily molded of one piece construction.

17. A method of covering an outdoor electrical device comprising the steps of:
   a) providing the cover for outdoor electrical devices as constructed in accordance with claim 13, b) providing the haspway opening through the other haspway by removing the web from the other haspway, c) closing the lid and registering the lid aperture with the haspway opening, and d) securing the electrical device against unauthorized access by extending the security member through the registered lid aperture and haspway opening.

18. A cover for outdoor electrical devices comprising a substantially rectangular base and a lid hinged to the base, the base having a pair of haspways positioned at diagonally opposite corners of the base, one haspway being positioned at an upper portion of the base and the other haspway being positioned at a lower portion of the base, the one haspway including an integral web precluding passage of water through the one haspway, the other haspway including a haspway opening, a lower portion of the lid including an aperture in registration with the haspway opening when the lid is closed, whereby a security member may be extended through the registered lid aperture and haspway opening.

19. The cover for outdoor electrical devices as constructed in accordance with claim 18 wherein the security member is selected from the group consisting of a padlock shackle, a bolt, a wire seal and a tie strap.

20. The cover for outdoor electrical devices as constructed in accordance with claim 18 wherein the base includes a peripheral flange and the pair of haspways are positioned within the peripheral flange.

\* \* \* \* \*